United States Patent
Otani

(10) Patent No.: US 7,336,029 B2
(45) Date of Patent: Feb. 26, 2008

(54) ORGANIC EL DISPLAY HAVING CONVEX PORTION WITH COLOR LAYERS

(75) Inventor: Shinju Otani, Yokohama (JP)

(73) Assignee: Optrex Corporation, Tokyo (JP)

( * ) Notice: Subject to any disclaimer, the term of this patent is extended or adjusted under 35 U.S.C. 154(b) by 183 days.

(21) Appl. No.: 10/902,011

(22) Filed: Jul. 30, 2004

(65) Prior Publication Data

US 2005/0057147 A1    Mar. 17, 2005

(30) Foreign Application Priority Data

Jul. 31, 2003    (JP) .............................. 2003-284133

(51) Int. Cl.
*H01J 1/62* (2006.01)
(52) U.S. Cl. ..................... 313/506; 313/504
(58) Field of Classification Search ................ 313/504, 313/506
See application file for complete search history.

(56) References Cited

U.S. PATENT DOCUMENTS

| | | | |
|---|---|---|---|
| 2003/0173897 A1* | 9/2003 | Iwase et al. ................ | 313/512 |
| 2004/0095060 A1* | 5/2004 | Ushifusa et al. ............ | 313/495 |
| 2004/0183432 A1* | 9/2004 | Liu et al. .................... | 313/503 |

FOREIGN PATENT DOCUMENTS

| | | |
|---|---|---|
| JP | 2000-030858 | 1/2000 |
| JP | 2000-277257 | 10/2000 |
| JP | A-2001-351779 | 12/2001 |
| JP | 07-142169 | 6/2007 |

OTHER PUBLICATIONS

U.S. Appl. No. 10/902,011, filed Jul. 30, 2004, Otani.
U.S. Appl. No. 10/996,405, filed Nov. 26, 2004, Otani, et al.

* cited by examiner

*Primary Examiner*—Joan Ton
*Assistant Examiner*—Bumsuk Won
(74) *Attorney, Agent, or Firm*—Oblon, Spivak, McClelland, Maier & Neustadt, P.C.

(57) ABSTRACT

On a substrate 111, a color filter each comprising color layers 1A, 1B, 1C of three primary colors (red, green and blue) and a liquid-material-spreading preventive member 26 are formed, the liquid-material-spreading preventive member being disposed at the region 31 outside the anode wire formed at the outermost side. Then, a protective layer 4, anodes 101 and cathode supplementary wires 121 are formed on the substrate and an insulation film 122 is formed thereon. In the insulation film 122, openings 123 are formed at positions corresponding to display pixels. Partition walls 100 are formed on the insulation film 122 and a solution of organic material is applied onto the insulation film to form a thin organic compound layer. The spreading of the solution is prevented by the presence of the liquid-material-spreading preventive member 26. After thin organic compound layers are formed, cathode wires 105 are formed.

10 Claims, 12 Drawing Sheets

PRIOR ART

ORGANIC EL DISPLAY HAVING CONVEX PORTION WITH COLOR LAYERS

The present invention relates to an organic EL (electroluminescence) display and a method for producing the same.

Developments on organic EL displays using an organic EL device have vigorously been made in recent years. The organic EL displays are expected as display devices of the next generation because they have a wide viewing angle, a high response speed and are capable of providing various modes of luminescence due to organic materials in comparison with liquid crystal display devices.

In the organic EL displays, organic EL devices having the following two kinds of structures have been utilized.

An organic EL device of the first structure has such a structure that color filters each having three primary colors (red, green and blue) are formed on a substrate, a protective layer is coated on the color filters, anodes are formed on the protective layer, a white-light-emitting type organic compound is applied in a thin film-like form on the anodes, and cathodes are formed on the organic compound layer so as to oppose the anodes formed on the substrate.

The organic EL device of the second structure has such a structure that anodes are formed on a substrate, an organic compound emitting three primary colors (red, green, blue) is applied in a thin film-like form on the anodes, and cathodes are formed on the organic compound layer so as to oppose the anodes formed on the substrate.

Each organic EL device is a current-drive type display device which can emit light when a current is supplied to an organic compound layer disposed between an anode and a cathode. Hereinbelow, a thin film of organic compound to be laminated is referred to as the thin organic layer. A location at which an anode, a plurality of thin organic layers and a cathode overlap provides a display pixel.

When an organic compound is coated on the electrodes provided on the substrate, there is a case that a thin organic layer is formed by vacuum deposition of the organic compound. However, in such case, if a foreign matter deposits on any electrode, or a projection or a recess is formed in the surface of the electrode under the thin organic layer, the thin organic layer can not be formed in a desired state due to such defect.

In order to solve this problem, there is known a technique that a solution obtained by dispersing or dissolving in liquid an organic material for a thin organic layer, is coated on the electrode to cover a foreign matter, a projection, a recess etc. to thereby obtain a desired thin organic layer (hereinbelow, referred to as the wet coating process, or more simply, as the coating process). For example, a patent document 1 (JP-A-2001-351779, Paragraphs 0012 to 0017, FIGS. 1 and 2) discloses that at least one layer in thin organic layers is formed by using the coating process.

As the coating process, there is an off-set printing method, a relief printing method, a mask spray method or the like, for instance. In the off-set printing method or the relief printing method, a solution obtained by dispersing or dissolving an organic material in a solvent is applied only to a predetermined region to form a layer. In the mask splay method, a mask made of metal having openings formed at positions corresponding to predetermined regions is located, and a solution obtained by dispersing or dissolving an organic material is sprayed on the mask. In this case, the solution is dispersed in a gaseous medium such as nitrogen or the like, or the solution is atomized by using a two-fluid type nozzle or the like.

In some organic EL displays, partition structures (hereinbelow referred to as partition walls) to separate each cathode wire on the thin organic layer are provided. Such construction is disclosed in, for example, the above-mentioned patent document 1. FIG. 9 is a cross-sectional view showing an example of separators disclosed in the patent document 1. On the substrate 111, anode wires 101 are provided, and then, the separators 100 are formed.

Each of the separators 100 is formed so that its horizontally cross-sectional area becomes larger as the position is away from the substrate 111, for example. This structure of such separator 100 is called as an inverted taper structure or an overhang structure. The separator 100 having the inverted taper structure can provide more secure separation to cathode wires. After the formation of the separators 100, each thin organic layer (a hole injection layer 102, a light emitting layer 103 and an electron injection layer 104) is formed by the coating process or the other process. Thus, the thin organic layers can be formed between adjacent separators 100. Then, cathode wires 105 are formed by, for example, a vacuum deposition method. Each of the cathode wires 105 is also separated by separators 100 whereby patterned cathode wires 105 are formed.

Further, there is a case that an insulation film having openings is formed on anode wires so that the positions of display pixels are determined by the positions of the openings. FIGS. 10 and 11 are diagrams showing an example of the structure disclosed in the patent document 1 wherein an insulation film having openings is provided. FIG. 10 is a diagram showing the substrate viewed from the side that electrodes are arranged, and FIG. 11 is a cross-sectional view taken along D-D' in FIG. 10. In FIG. 10, the lower structure hidden by cathode wires etc. as upper layers is also shown.

In the example shown in FIG. 10, anode wires 101 and cathode supplementary wires 121 to be connected to cathode wires are first formed on the substrate 111. Then, an insulation film 122 having openings 123 is formed thereon. The positions of the openings 123 are determined at the positions where anode wires and cathode wires cross to each other. Then, separators 100 are formed so that they cross perpendicularly to the anode wires 101. Thereafter, a solution of an organic material is coated or deposited to form a first thin organic layer 124. In fact, a plurality of layers are formed as thin organic layers. In FIG. 11, however, the plurality of layers are represented by the first thin organic layer 124.

When the solution is coated, the concentration of the organic material is adjusted so that a thin organic layer can be formed in a predetermined thickness in a necessary region. After the formation of the first thin organic layer 124, the cathode wires 105 are formed by vapor deposition on the thin organic layer. The separators 100 separate the thin organic layer 124 and the cathode wires 105. Accordingly, each of the first thin organic layers 124 and each of patterned cathode wires 105 are provided between adjacent separators 100.

There is a case that after the formation of the cathode wires 105, a second thin organic layer comprised of a polymer or the like is formed on the cathode wires 105 in order to protect the organic EL device. The second thin organic layer (not shown) can also be formed by a coating process or the like.

On the surface on which the electrodes and so on are arranged, of the substrate 111, another substrate (not shown) is disposed in a face-to-face relation. A sealing material (not shown) is coated on the outer peripheral region of the substrate surface opposing the organic EL device on the substrate 111. With this sealing material, the substrate 111 and the other substrate are bonded to each other. Due to the sealing effect by the substrates and the sealing material, the organic EL device can be prevented from being in contact with moisture or oxygen.

In the above-mentioned technique, there is a problem that when the solution of the organic material is coated after the separators 100 are provided, the coated solution spreads along the separators 100. For example, in the example shown in FIG. 10, the solution spreads along the portions where side surfaces of the separators 100 intersect with the insulation film 122. It is because there takes place a phenomenon like capillarity in a space at or near a portion where a side face of a separator 100 intersects with the front surface of the insulation film 122. In particular, when a separator 100 having an inverted taper structure is provided to separate certainly the cathode wires 105 and so on, the space at the portion where the side face of the separator 100 intersects with the front surface of the insulation film 122 is narrower whereby the solution spreads more easily.

FIG. 12 is a diagram showing a state that the solution of the organic material spreads along separators. FIG. 12 shows only the relation of the separators 100 to the solution 125 of the organic material, and other structural portions are omitted. In FIGS. 10 and 12, the region surrounded by a broken line indicates the range of the coated solution staying there without spreading. Namely, it is ideal that the solution does not spread over the region surrounded by the broken line. However, as described above, the solution 125 tends to spread along the separators 100 over the region indicated by the broken line as shown in FIG. 12. In other figures too, the region that the solution should stay is shown with a broken line.

The spreading of the solution creates the following problem. If the solution spreads, a thin film is formed extending to the position that the sealing material is provided to bond the opposing substrates. If the sealing material to bond these substrates together contacts this thin film, the bonding strength of the sealing material decreases. As a result, moisture or oxygen enters between the substrates so that the organic EL display contacts the moisture or oxygen to thereby reduce reliability on the organic EL device.

Further, if the solution spreads to form a thin organic film on a cathode supplementary wire 121, the thin organic film functions as a resistive element between the cathode supplementary wire 121 and a cathode wire 105 to be formed by vapor deposition. Since the organic EL display is operated by feeding a current between cathode wires 105 and anode wires 101, the presence of the resistive element between a cathode supplementary wire 101 and a cathode wire 105 causes heat generation. Further, there may result a defect of connection between the cathode wire 105 and the cathode supplementary wire 121 due to the resistive element.

As described above, the concentration of the solution is adjusted so that a thin film having a predetermined thickness can be obtained. However, if the solution spreads along the separators 100, it is difficult to obtain a film of a desired thickness. Further, since the solution in the outer peripheral portion of the region indicated by the broken line spreads easily toward an outer side, the thickness of the formed thin organic layer becomes thinner as the position is away from the outer peripheral portion of the region indicated by the broken line. As a result, the formed thin organic film has an uneven thickness whereby there causes an uneven light emission when each display pixel is activated.

The problem resulted by the spreading of the solution takes place also in the case that a second thin organic layer composed of a polymer or the like is formed on the cathode wires 105 by a coating process in order to protect the organic EL device. When the second thin organic layer extends outside over the predetermined region, the function of protecting the organic EL device becomes weak whereby problems such as the aged deterioration on the quality of display, the reduction of reliability on the produced devices etc. occur.

It is an object of the present invention to provide an organic EL display, in particular, an organic EL display having the above-mentioned first structure, capable of preventing liquid applied to form a thin organic layer from spreading, and preventing the reduction of the bonding strength of the sealing material, and reducing a possible formation of a resistive element and a possible occurrence of uneven light emission, and a method for producing such organic EL display.

According to a first aspect of the present invention, there is provided a method for producing an organic EL display, comprising forming color layers on a substrate, forming a first electrode on the color layers, forming first organic compound layers on the first electrode and forming a second electrode on the first organic compound layers, wherein after a liquid-material-spreading preventive member is formed at the position other than a display pixel area, a liquid material for at least one layer in the first organic compound layers is applied, or a liquid material for a second organic compound layer is applied on the second electrode.

In a second aspect of the present invention, there is provided the method according to the first aspect wherein the liquid-material-spreading preventive member is constituted with the color layers.

In a third aspect of the present invention, there is provided the method according to the first aspect or the second aspect, wherein the height of the liquid-material-spreading preventive member is from 1.4 to 5.0 μm.

In a fourth aspect of the present invention, there is provided the method according to the first aspect, the second aspect or the third aspect, wherein the width of the liquid-material-spreading preventive member in a longitudinal direction of the first electrode is from 30 to 1000 μm.

In a fifth aspect of the present invention, there is provided the method according to the first aspect, the second aspect, the third aspect or the fourth aspect, wherein the liquid-material-spreading preventive member and the color layers disposed under the first electrode are formed simultaneously.

In accordance with a sixth aspect of the present invention, there is provided an organic EL display comprising a substrate and color layers, a first electrode, a plurality of organic compound layers and a second electrode which are formed on the substrate in this order, wherein at least one layer in the plurality of organic compound layers is formed by disposing a liquid material two-dimensionally, and a convex portion comprising the color layers is provided at the position other than a display pixel area.

In a seventh aspect of the present invention, there is provided the organic EL display according to the sixth aspect, wherein the convex portion has a lamination structure comprising a plurality of color layers.

In an eighth aspect of the present invention, there is provided the organic EL display according to the seventh aspect, wherein the surface area of an upper layer in the convex portion is smaller than the surface area of the lowermost layer in the convex portion.

In a ninth aspect of the present invention, there is provided the organic EL display according to the sixth, seventh or eighth aspect, wherein the width of an upper layer in the convex portion, in a vertical cross-sectional view of the convex portion, is made continuously smaller than the width of the lowermost layer in the convex portion.

In a tenth aspect of the present invention, there is provided the organic EL display according to the sixth, seventh, eighth or ninth aspect, wherein $\theta_1$ is form 0.17 to 0.41° and $\theta_2$ is from 0.17 to 0.41° where $\theta_1$ represents the elevation angle observed from the point where the lowermost layer in the convex portion contacts the substrate surface to the corner portion of the uppermost layer, at a side of the convex portion in cross section, and $\theta_2$ represents the elevation angle observed from the point where the lowermost layer in the convex portion contacts the substrate surface to the corner portion of the uppermost layer, at the other side of the convex portion.

In an eleventh aspect of the present invention, there is provided the organic EL display according to the sixth, seventh, eighth, ninth or tenth aspect, wherein $\theta_1$ is form 0.75 to 1.8° and $\theta_2$ is from 0.75 to 1.8° where $\theta_1$ represents the elevation angle observed from the point where the lowermost layer in the convex portion contacts the substrate surface to the corner portion of the uppermost layer, at a side of the convex portion in cross section, and $\theta_2$ represents the elevation angle observed from the point where the lowermost layer in the convex portion contacts the substrate surface to the corner portion of the uppermost layer, at the other side of the convex portion.

In a twelfth aspect of the present invention, there is provided the organic EL display according to the sixth, seventh, eighth, ninth, tenth or eleventh aspect, wherein the convex portion is symmetrical in its vertical cross-sectional shape.

In a thirteenth aspect of the present invention, there is provided the organic EL display according to any one of the sixth to twelfth aspects, wherein the convex portion has a lamination structure comprising a plurality of color layers and the layer thickness of each color layer is substantially equal.

In a fourteenth aspect of the present invention, there is provided the organic EL display according to any one of the sixth to thirteenth aspects, wherein the convex portion has a stepwise structure by laminating a plurality of color layers, and the order of color arrangement of the laminated layers is the same as the order of color arrangement of each display pixel.

In a fifteenth aspect of the present invention, there is provided the organic EL display according to any one of the sixth to fourteenth aspects, wherein the width of each color layer in the plurality of color layers constituting the convex portion is substantially the same, and the convex portion is formed by shifting the position of each color layer by a predetermined length n when the plurality of color layers are laminated.

In a sixteenth aspect of the present invention, there is provided the organic EL display according to any one of the sixth to fifteenth aspects, wherein the space between adjacent color layers in each display pixel has a predetermined length n.

In a seventeenth aspect of the present invention, there is provided the organic EL display according to any one of the sixth to sixteenth aspects, wherein the color layers emitting three different colors are provided.

In drawings.

Preferred embodiments of the organic EL display of the present invention will be described with reference to the drawings.

Figure 1:
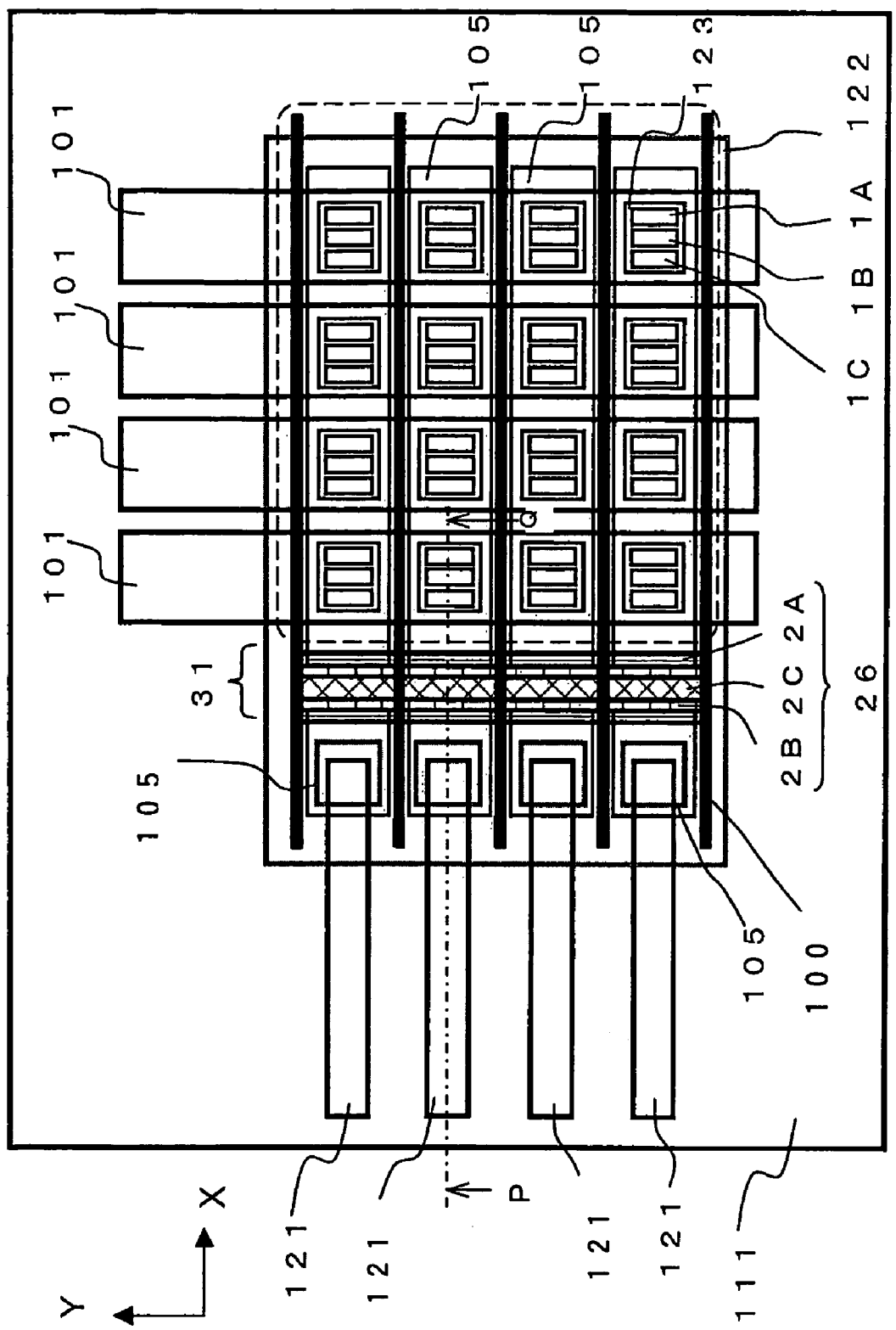
FIG. 1 is a diagram showing the structure of the organic EL display according to an embodiment of the present invention.
Figure 2:
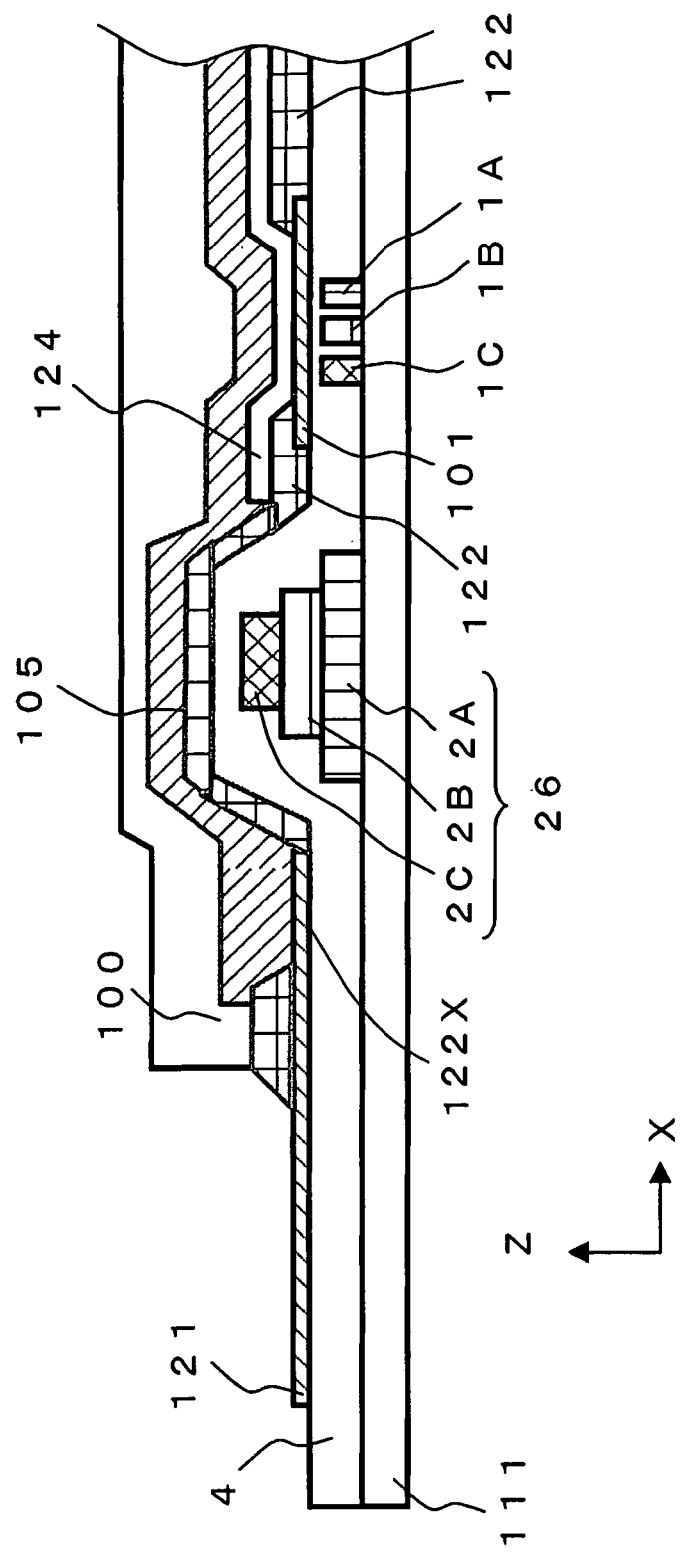
FIG. 2 is a cross-sectional view of the organic EL display taken along a P-Q cross-section, in Example 3.

FIG. 1 is a diagram showing an embodiment of the structure of the organic EL display of the first structure according to the present invention, the diagram being observed from the side that electrodes are arranged. FIG. 2 is a cross-sectional view of the display taken along a P-Q line in FIG. 1. In FIG. 1, the lower structure hidden by the electrodes etc. formed as upper layers is also shown. In FIG. 2, a separator located in a depth direction is also shown.

In FIG. 2, color filters each comprising color layers 1A, 1B, 1C of three primary colors (red, green and blue) are formed on a substrate 111. A member for preventing a liquid material from spreading (hereinbelow, referred to as a liquid-material-spreading preventive member) 26 is provided at the position other than a display pixel area. The heights of the color layers 1A, 1B, 1C of red, green and blue are in a range of, for example, from 0.7 to 1.7 µm. In FIG. 1, hatched lines are put for each of the color layers in order to discriminate each layer in the liquid-material-spreading preventive member 26.

Here, "the position other than the display pixel area" means the region outside the anode wire located at the outermost position. In FIG. 1, for example, the region 31 outside the anode wire 101 located at the outermost position on a left side in the figure corresponds to the region other than the display pixel area, and the liquid-material-spreading preventive member 26 is disposed in the region 31 outside the anode wire located at the outermost position.

FIG. 1 shows an example that the liquid-material-spreading preventive member 26 is formed by using the same kinds of color layers as the color layers 1A to 1C for the color filters in which a red color, a green color and a blue color are arranged in this order. The height of the liquid-material-spreading preventive member 26 is in a range of, for example, from 1.4 to 5.0 µm.

A protective layer 4 is coated on the color filters and the liquid-material-spreading preventive member 26, and cathode supplementary wires 121 connectable to anode wires 101 and cathodes are formed on the protective layer 4. An insulation film 122 is formed on the substrate 111 provided with the anode wires 101 and the cathode supplemental wires 121. The film thickness of the insulation film 122 is, for example, 0.7 µm. The insulation film 122 is provided with openings 123 at positions where the anode wires 101 and the cathode wires 105 cross (namely, at positions corresponding to display pixels).

The insulation film 122 is in contact with the anode wires 101 or the protective layer 4 except for the locations of the openings 123. On the insulation film 122, a plurality of thin organic layers 124 (organic compound layers) and the cathode wires 105 are laminated in sequence (the thin organic layers are omitted in FIG. 1). Before the thin organic layers are formed, separators 100 for partitioning adjacent cathode wires are disposed.

When the cathode wires 105 are formed by vapor deposition or the like, the separators 100 are formed to have a predetermined pattern. As shown in FIG. 1, for example, a plurality of separators 100 crossing perpendicularly to the anode wires 101 are formed so that the cathode wires 105 cross perpendicularly to the anode wires 101. It is preferred that each separator 100 has an inverted taper structure. Namely, it is preferred that the width of the separator in its horizontally cross-sectional shape increases as the position in a vertical direction of the separator is away from the substrate 111. The height of the separator 101 is, for example, 3.4 µm.

When the thin organic layers are laminated by coating solutions of organic materials, the separators 100 separate the thin organic layers therebetween. Similarly, when the cathode wires 105 are formed by vapor deposition, the separators 100 separate them therebetween, with the result that a plurality of cathode wires 105 can be arranged as shown in FIG. 1. In other words, the separators 100 are positioned at both sides of each cathode wire 105. The thickness of the thin organic layers is in a range of, for example, from 10 to 100 nm. Further, the thickness of the cathode wires 105 is, for example, 100 nm.

Thus, by laminating the plurality of thin organic layers and the cathode wires 105 on the substrate 111, such structure that there are the plurality of thin organic layers between the anode wires 101 and the cathode wires 105 at respective openings 123, is provided. Thus, by supplying a constant current from an anode wire side to a cathode wire side at each opening 123, the thin organic layers corresponding to the position of the opening 123 functions as a light-emitting layer to emit light.

Further, another substrate (not shown) is arranged opposing to the functioning surface of the substrate 111 (see FIG. 1). The other substrate is applied with a sealing material (not shown) in its outer periphery of the region opposing the surface provided with the organic EL device, of the substrate 111. These two substrates are bonded together by means of the sealing material.

Each of the cathode supplementary wires 121 is connected to a scanning electrode driver (not shown), and each anode wires 101 is connected to a signal electrode driver (not shown). In activating the organic EL display, the scanning electrode driver selects sequentially each cathode wire 105. Further, the signal electrode driver supplies a current from an anode wire to a cathode wire in a selected line so that a display pixel in the selected line emits light.

When a solution of an organic material is applied, the solution tends to spread to an outer side of the insulation film 122 along the portions where sides of a separator 100 are in contact with the surface of the insulation film 122. However, the solution is prevented from spreading because the liquid-material-spreading preventive member 26 acts as a dam. Thus, the solution does not spread to the position of the sealing material which bonds the two opposing substrates together, and therefore, it is possible to prevent the reduction of the bonding strength of the sealing material. As a result, there is little possibility that the organic EL device contacts moisture or oxygen, and accordingly, reliability on the organic EL device can be maintained.

Further, the liquid-material-spreading preventive member 26 to prevent the spreading of the solution minimizes the possibility that a thin organic film is formed as a resistive element on a cathode supplementary wire 121. Accordingly, a defect of contact between a cathode supplementary wire 121 and a cathode wire 105 or heat generation in the operation can be prevented. Further, unevenness in the thickness of the thin organic layers can be reduced and unevenness of light emission can be reduced.

Further, even in a case of forming a second thin organic layer composed of a polymer or the like on the cathode wires 105 in order to protect the organic EL display, the spreading of the solution can be prevented by the liquid-material-spreading preventive member 26. The thicknesses of the second thin organic layer and the cathode wires 105 are from 10 to 100 nm and about 100 nm respectively. Accordingly, even after forming the cathode wires 105, the liquid-material-spreading preventive member 26 can keep its convex shape. Therefore, even when the solution was coated on the cathode wires 105 to form the second thin organic layer, the spreading of the solution can be prevented.

On one side of each of the cathode supplementary wires 121, which is indicated by reference numeral 122X in FIG. 2, the insulation film 122 is extended under the separators 100 except for the connecting portions of the cathode wires 105 and the cathode supplementary wires 121.

Figure 3:
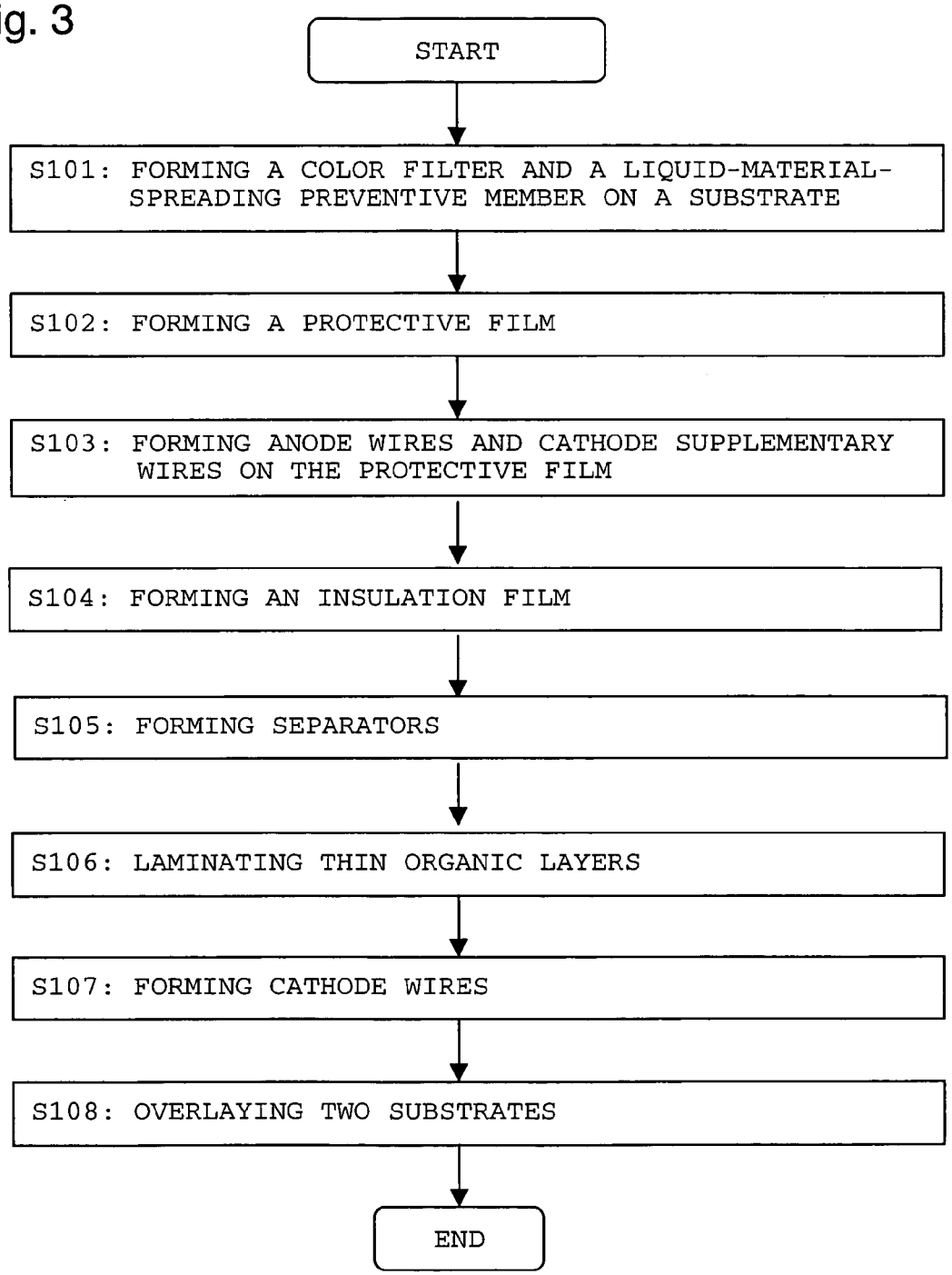
FIG. 3 is a flowchart showing an example of the method for producing an organic EL display according to the present invention.

Next, a method for producing the organic EL display of the present invention will be described with reference to FIGS. 1 to 3. FIG. 3 is a flowchart showing an example of the method for producing the organic EL display of the present invention.

First, color layers are formed on the substrate 111 to form color filters as shown in FIGS. 1 and 2. As the substrate 111, a transparent substrate such as a glass substrate is used, for example. There is in particular no limitation as to the method for forming the color filters, and a pattern of the color filters can be formed by photo-engraving after spin-coating or a pattern of the color filters can be formed by photo-engraving after roll-coating. As the material for the color layers, a photosensitive acrylic resin, a pigment dispersive photoresist or the like may be used. Further, the height of the color filters can be in a range of from 0.7 to 1.7 µm, for example.

The liquid-material-spreading preventive member 26 is disposed at the position other than display pixel area (the region 31 outside the anode wire located at the outermost position) (Step S101). In order to simplify the process, the liquid-material-spreading preventive member 26 may be formed at the same time of forming the color filters by using the same material as the color layers for the color filters.

Figure 4:
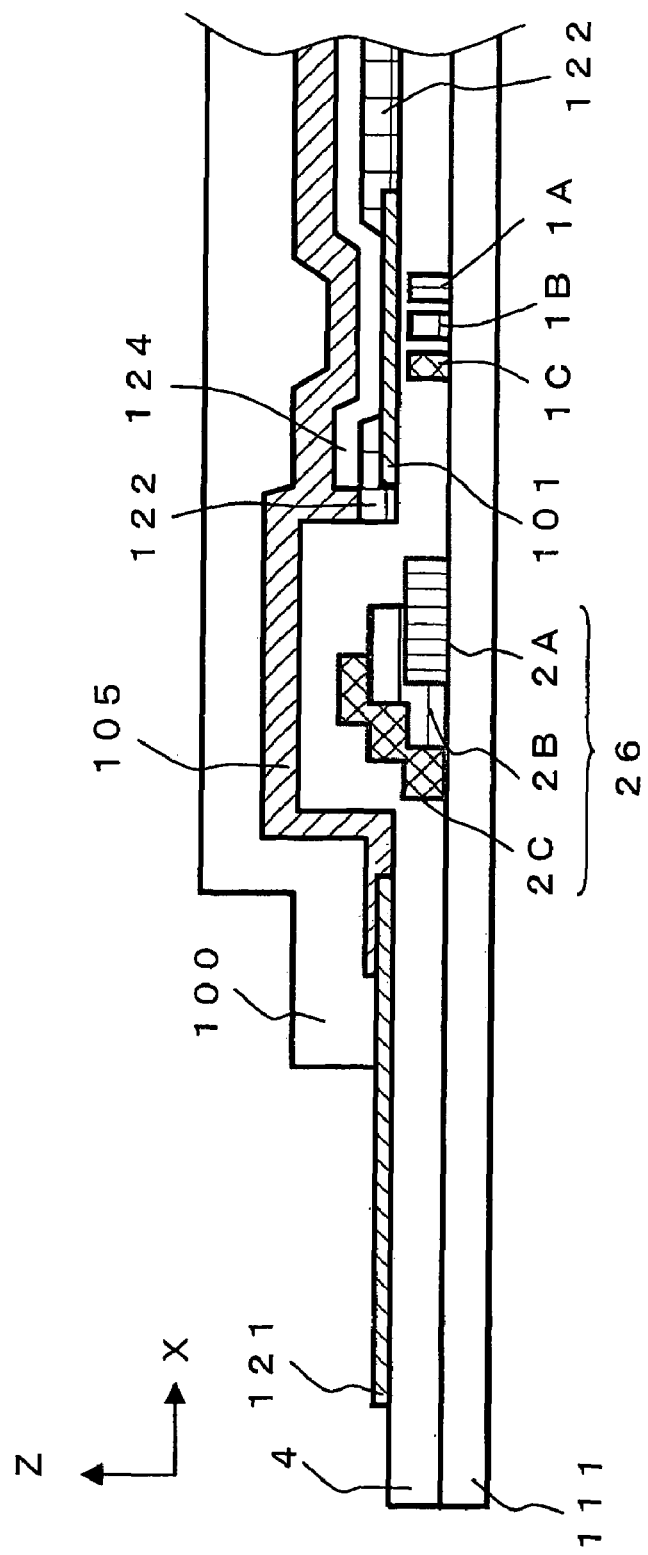
FIG. 4 is a cross-sectional view showing the organic EL display taken along a P-Q cross-section, in Example 1.
Figure 5:
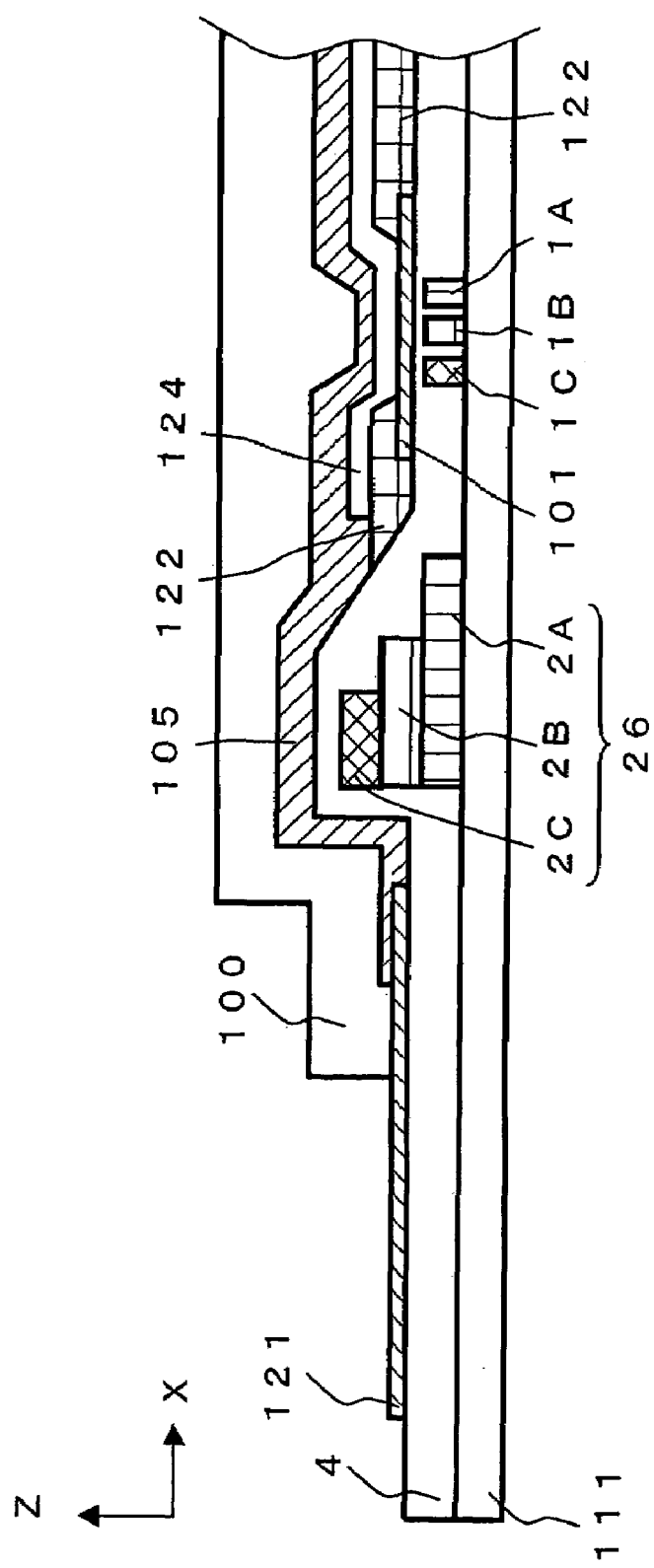
FIG. 5 is a cross-sectional view of the organic EL display taken along a P-Q cross-section, in Example 2.
Figure 6:
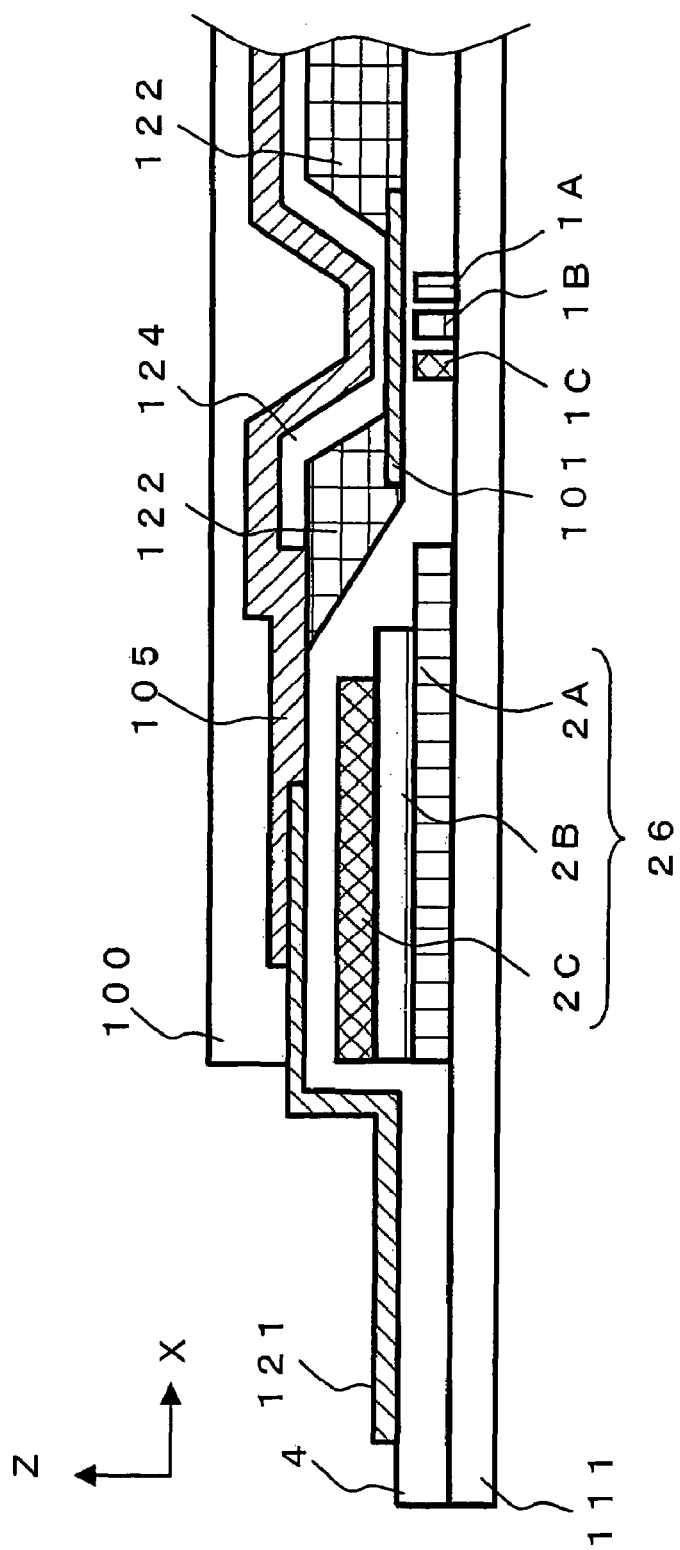
FIG. 6 is a cross-sectional view of the organic EL display taken along a P-Q cross-section, different from the organic EL display shown in FIG. 1.

FIGS. 4 to 6 are cross-sectional views of organic EL displays in which liquid-material-spreading preventive members 26 having different cross-sectional shapes from that shown in FIG. 2 are used.

The cross-sectional shape of each of the liquid-material-spreading preventive members 26 may be a two-step convex member comprising a layer of rectangular shape and layers of hooked rectangular shape, each in cross-sectional shape, as shown in FIG. 4, may be a two-step convex member comprising three layers of rectangular shape in cross-section having different widths as shown in FIG. 2 or a two-step convex member, at its only one side, comprising three layers of rectangular shape in cross-section having different widths as shown in FIG. 5. Although FIGS. 4 to 6 show examples that each liquid-material-spreading preventive member 26 has a three-layer structure comprising three color layers, the liquid-material-spreading preventive member 26 may be formed by using one or two color layers.

In the most preferable form of the liquid-material-spreading preventive member of the present invention, three color layers of three primary colors are used and the height of it is the sum of the thicknesses of these layers. Then, the spreading of the liquid material can be prevented by the preventive member thus formed.

Generally, the mask usable for a photolithography technique (hereinbelow, referred to as the photolithography mask) to form the color layers for color filters is not prepared for each color but only one mask for a specified color layer is prepared. Another color layer can be formed by off-setting or shifting the prepared mask by the pitch of the pixels. This is because the photolithography mask is expensive, and the number of masks should be reduced from the standpoint of cost performance.

Figure 7:
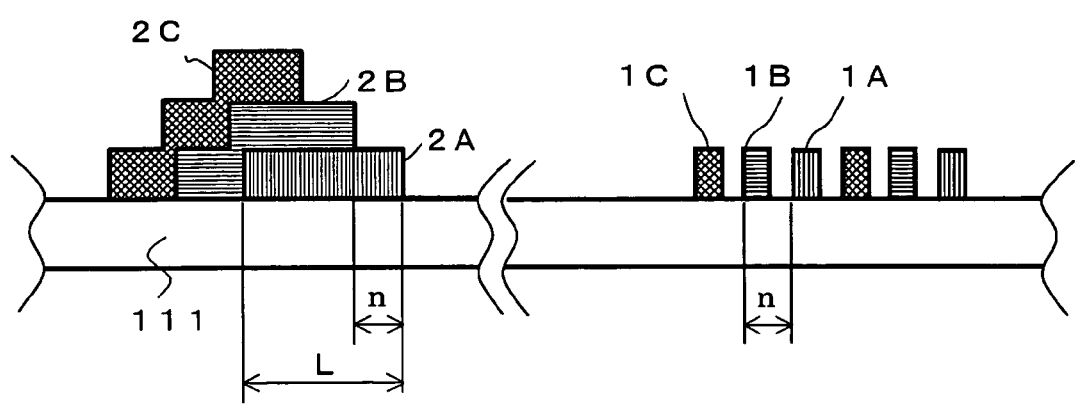
FIG. 7 is a diagrammatical cross-sectional view showing an embodiment of the liquid-material-spreading preventive member.

With reference to FIG. 7, a method for producing a color filter usable for three colors with a single photolithography mask as well as being capable of determining the width of the liquid-material-spreading preventive member, will be described. The photolithography mask for the color layers of color filters has a pattern comprising a portion 1A for forming a color layer and a portion 2A of the liquid-material-spreading preventive member in its plane. After the color layer and the portion of the liquid-material-spreading preventive member have been formed, the photolithography mask is shifted by "n" in a predetermined direction in order to form a second color layer 1B and a portion 2B of the liquid-material-spreading preventive member. The distance "n" corresponds to a pixel pitch of the display device to be prepared. Further, a third color layer 1C and a portion 2C of the liquid-material-spreading preventive member are formed.

The height of the liquid-material-spreading preventive member can be increased by overlapping the second color layer and the third color layer on the first color layer, i.e., by shifting the mask by "n" respectively in a horizontal direction. Here, the width L of the liquid-material-spreading preventive member is preferably to have a relation of "L≧2n".

As described above, the color layers and the liquid-material-spreading preventive member can be formed by shifting a single photolithography mask by a pixel pitch. Of course, it is possible to prepare photolithography masks for each color to form the color filters and the liquid-material-spreading preventive member.

Assuming that the liquid-material-spreading preventive member is formed by shifting a single photolithography mask by a predetermined length "n", the shape of its convex portion is expressed by the following formulas, for example:

$ATN(0.7*3 \ \mu m/[80*2 \ \mu m]) \leq \theta_1, \theta_2 \leq ATN(1.7*3 \ \mu m/[80*2 \ \mu m])$ Since n=80, the bottom side is doubled. Accordingly, the following formulas are provided.

$ATN(2.1/160) \leq \theta_1, \theta_2 \leq (5.1/160)$ $0.75° \leq \theta_1, \theta_2 \leq 1.8°$.

When a color resist is laminated, the thickness of an over-coated portion is likely to be thinner than the portion in the region without having an undercoat layer. Namely, it is well predictable that $\theta_1$ is smaller than 0.75°. This value of angle varies depending on the viscosity of a usable resist or a coating process.

It is preferred that the width of the liquid-material-spreading preventive member 26 in a direction of spreading is from 30 to 1000 μm. If the width is less than 30 μm, it is difficult to reproduce the shape of the liquid-material-spreading preventive member 26. If it exceeds 1000 μm, it is difficult to satisfy the requirement of a small width of a panel frame as an item required for the panel. Namely, it is against the requirement of miniaturizing the panel.

The liquid-material-spreading preventive member 26 may be extended to the end portions of the separators or the end portions of the cathode wires. In this case, curved portions in the cathode wires can be lessened whereby more secure formation of the cathode wires is obtainable. FIG. 6 is a cross-sectional view of the organic EL display in which the liquid-material-spreading preventive member 26 is extended to the end portions of the separators. As seen in the figure, the curved portion of a cathode wire in the position near the cathode supplementary wire is eliminated.

Then, a protective layer 4 is formed on the color filters (Step S102). The protective layer 4 is formed by coating a solution of, for example, acrylic resin. The thickness of the protective layer 4 can be, for example, 1 μm.

Further, anode wires 101 and cathode supplementary wires 121 are formed on the protective layer 4 (Step S103). The anode wires 101 and the cathode supplementary wires 121 can be formed by forming on the protective layer 4 ITO (indium-tin oxide) followed by etching.

Then, an insulation film 122 is formed on the protective layer 4 on which the anode wires 101 are formed (Step S104). The insulation film 122 is formed by coating, for example, a solution of polyimide. The film thickness of the insulation film 122 can be, for example, 0.7 μm. After the insulation film is formed, portions of the insulation film at positions corresponding to display pixels are removed to form openings 123. The crossing portions of the anode wires 101 to the cathode wires 105 to be formed at Step S107, which described later, correspond to positions of the display pixels.

Subsequently, separators 100 for partitioning adjacent cathode wires are formed on the insulation film 122 (Step S105). In this case, the positions of the separators 100 to partition the cathode wires are at both sides of each cathode wire. Since the cathode wires 121 are formed so as to cross perpendicularly to the anode wires 101, the separators 100 are also formed so as to cross perpendicularly to the anode wires 101. As the material of the separators 100, an acrylic resin film can be used, for example. The height of the separators 100 can be, for example, 3.4 μm. It is preferred to form the separators 100 to have an inverted taper structure wherein the horizontally cross-sectional area of each separator increases as the position of it in a vertical direction is away from the substrate 111. The separators having such inverted taper structure can separate certainly the thin organic layers and the cathode wires 105.

After the separators are formed, each thin organic layer is laminated (Step S106). A metal mask having openings defining light-emission regions is previously prepared, and it is attached onto the substrate 111 at Step S106. Then, a solution for forming a hole injection layer is coated thereon by, for example, a mask spray method. By the mask spray method, the solution can be arranged at correct positions. As the solution for forming the hole injection layer, an ethyl benzoate solution obtained by dissolving 0.5% (mass %) of polyvinyl carbazole can be mentioned, for example.

The coated solution is apt to spread along the separators 100. However, the spreading of the solution is stopped by the presence of the liquid-material-spreading preventive member 26 in the region 31 whereby the solution does not spread to the position of possibly contacting with the sealing material or the portions where the cathode supplementary wires 121 and the cathode wires 105 contact with each other. Further, unevenness of the thickness of the thin organic layers (specifically, the hole injection layer in this case) at each opening 123 can be reduced.

On the hole injection layer, a hole transfer layer and a light emitting layer are laminated sequentially. Even when solutions are coated to form these layers, the spreading of the liquid materials can be prevented by the liquid-material-spreading preventive member 26. The hole transfer layer and the light emitting layer may be laminated by a vapor deposition method.

After the formation of a cathode interface layer, cathode wires 105 are formed (Step S107). At Step S107, the cathode interface layer is formed on the light emitting layer by vapor deposition, and the cathode wires 105 are formed on the cathode interface layer by vapor deposition. The cathode interface layer can be formed by vapor-depositing LiF, and the cathode wires can be formed by vapor-depositing aluminum, for example.

Figure 8:
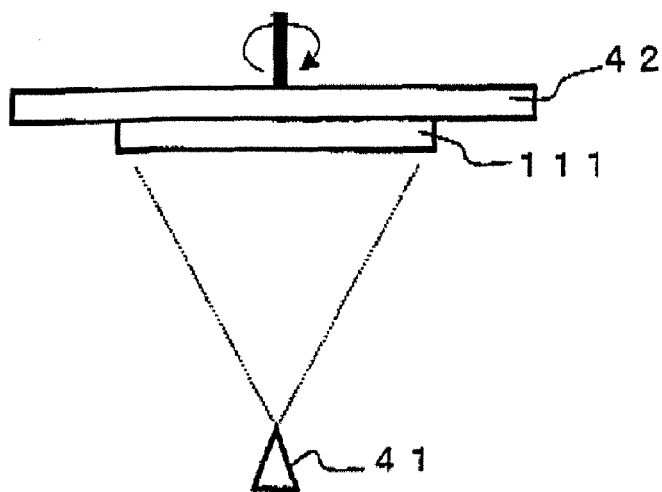
FIG. 8 is a diagram showing a method for depositing a cathode wire.
Figure 9:
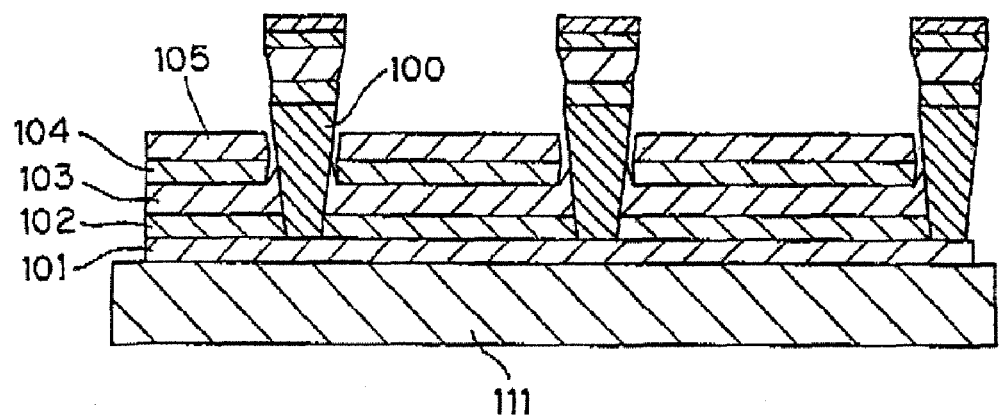
FIG. 9 is a cross-sectional view showing separators according to a conventional technique.
Figure 10:
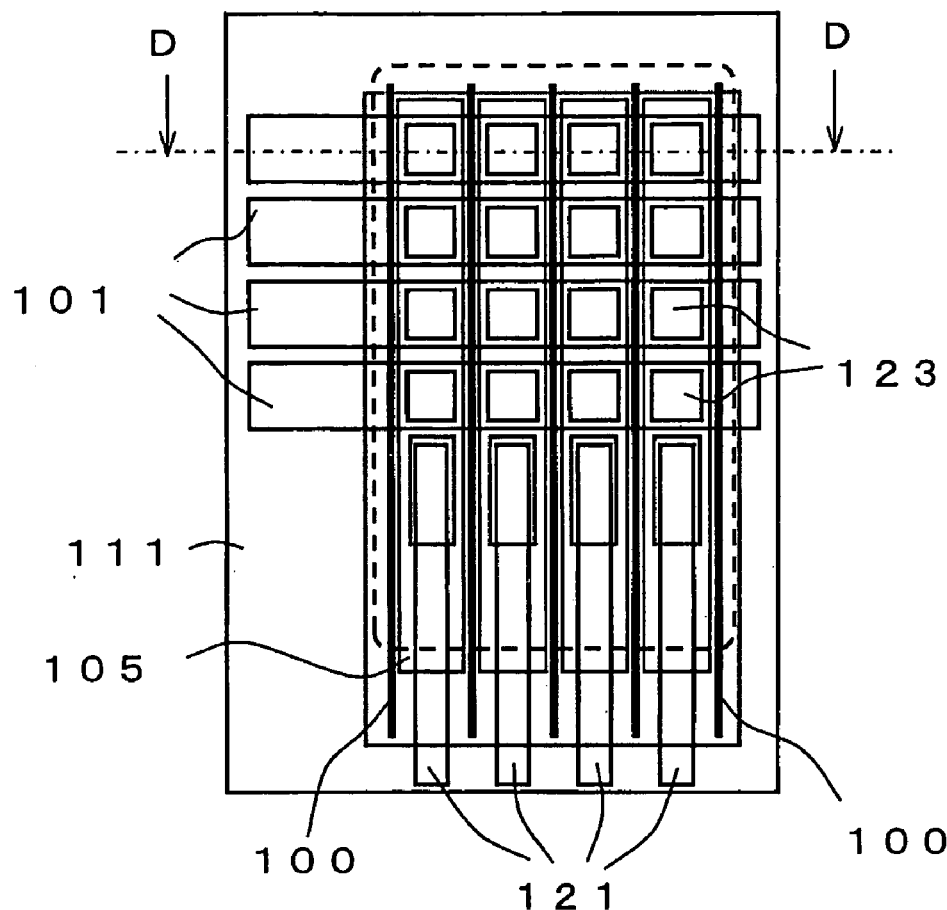
FIG. 10 is a diagram showing an example of the structure in which an insulation film is disposed in a conventional organic EL display having separators.
Figure 11:
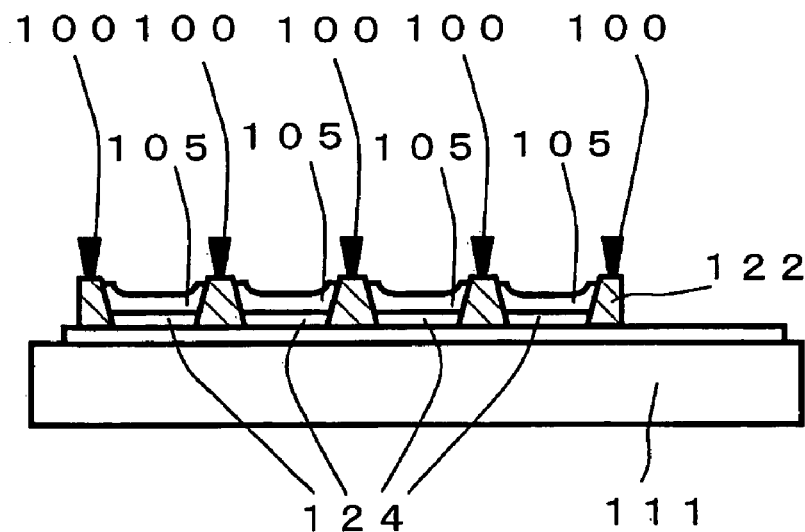
FIG. 11 is a cross-sectional view of the conventional organic EL display taken along a D-D' line in FIG. 10.
Figure 12:
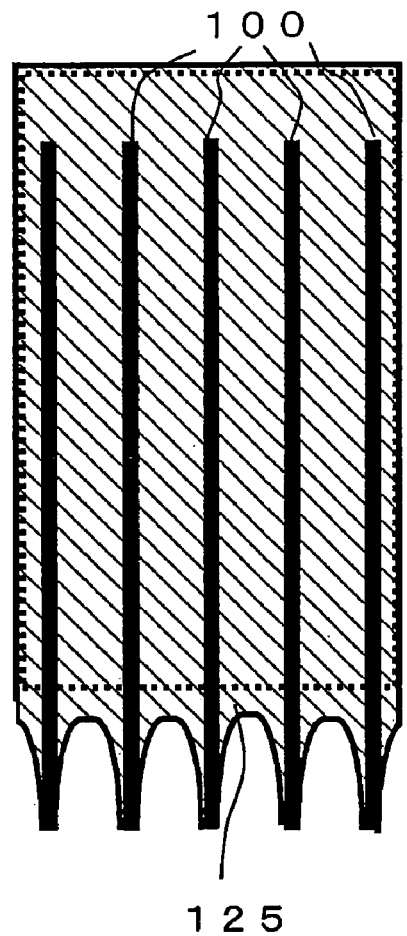
FIG. 12 is a diagram showing a state that a solution containing an organic material spreads along separators.

FIG. 8 is a diagram showing a method for vapor-depositing the cathode wires 105. A material (e.g., aluminum) for the cathode wires 105 is injected through an injector 41 toward the substrate 111. Since the substrate 111 is rotated by means of a rotating supporter 42, the cathode wires 105 can be formed uniformly at predetermined positions (between adjacent separators) on the substrate 111.

At Step S106 and Step S107, the thin organic layers, the cathode interface layer and the cathode wires 105 are separated by the separators so as to be provided in predetermined regions between adjacent separators 100.

Then, on a substrate (not shown) to be opposed to the substrate 111, a sealing material is coated in an outer peripheral portion of the region to be opposed to the organic EL device on the substrate 111. Then, the substrate applied with the sealing material is overlaid on the substrate 111 (Step S108).

In accordance with the above-mentioned method for producing the organic EL display, the spreading of the solutions, which may occur when the solutions of organic materials are coated at Step S106, can be prevented by means of the liquid-material-spreading preventive member 26. Accordingly, there is little possibility that the thin organic layers are formed at the portion of possibly contacting with the sealing material on the substrate 111 whereby the bonding strength of the sealing material does not decrease, and the possibility that moisture or oxygen enters between the substrates can be minimized, hence, the reduction of the performance of the organic EL display can be prevented. Further, since there is found no formation of thin organic layers at the connecting portions between the cathode supplementary wires 121 and the cathode wires 105 at Step S107, an excellent state of connection between the cathode supplementary wires 121 and the cathode wires 105 can be provided, hence, heat generation in the operation is avoidable. Further, since unevenness of the thickness of the thin organic layers at the openings 123 can be reduced, unevenness of light emission can also be reduced.

Figure 15:
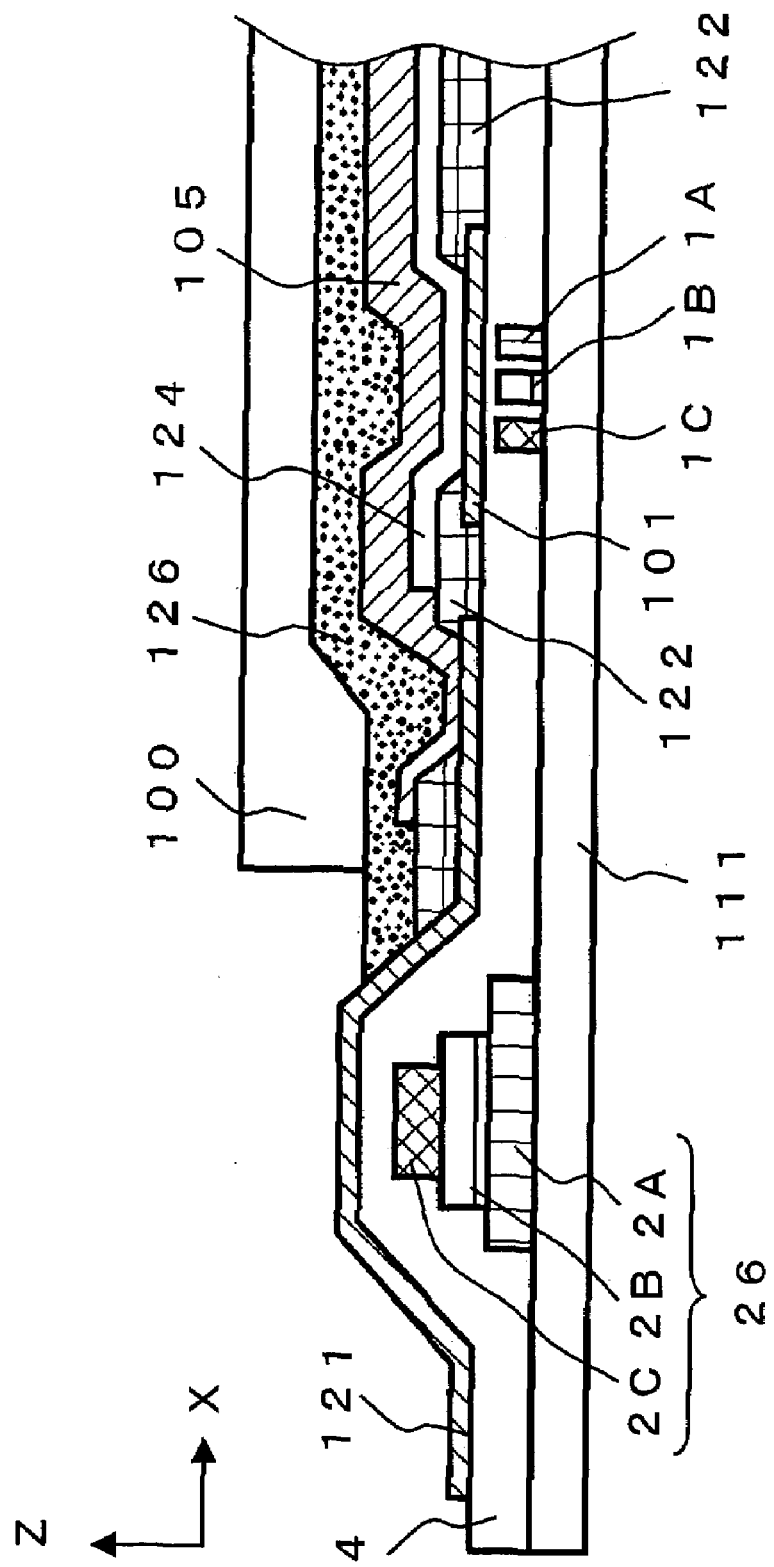
FIG. 15 is a diagrammatical cross-sectional view showing an example of the structure having a second thin organic layer and a liquid-material-spreading preventive member 26.

Before carrying out Step S108, a second thin organic layer composed of a polymer or the like may be formed on the cathode wires 105. This second thin organic layer serves to protect the organic EL device. Even when the second thin organic layer is formed by a coating process, the spreading of the solution can be prevented by the presence of the liquid-material-spreading preventive member 26. FIG. 15 is a diagram showing structures of a second thin organic layer 126 and a liquid-material-spreading preventive member 26, as an embodiment.

Further, it is possible that a part of the liquid-material-spreading preventive member 26 is formed by using the same material as a color layer or the same materials as color layers for the color filters, and the remaining part of the liquid-material-spreading preventive member 26 is formed by using a material for the insulation film when the insulation film is formed on the protective layer 4. When the liquid-material-spreading preventive member 26 is formed by using the same materials as the color layers for the color filters, the height of the liquid-material-spreading preventive member 26 is determined by the height of a color filter having these color layers. Accordingly, there is a case that the height of the liquid-material-spreading preventive member 26 is insufficient if the height of the color layers for the color filters is low. In such case, the material of the insulation film can be used to obtain a sufficient height when the insulation film is formed on the protective layer 4.

EXAMPLE

In the following some preferred Examples of the present invention will be described. However, it should be understood that the present invention is by no means restricted by such specific Examples.

Example 1

On a glass substrate, colored layers of red color, blue color and green color are formed by a spin coating method followed by etching whereby color filters each having a thickness of 1 μm are formed wherein the position of each color filter corresponds to each display pixel. In each color filter, the pixel pitch is 80 μm. At the same time of forming the color filters, a liquid-material-spreading preventive member is formed in the region outside the anode wire located at the outermost position. The height of the liquid-material-spreading preventive member is 1 μm, and the width of the first electrode in its longitudinal direction (an X direction in FIG. 4) is 200 μm. The same photolithography mask is used to form a second color filter element by shifting it to a 80 μm off-set position with respect to the first color filter element. Similarly, a third color filter element is formed. The liquid-material-spreading preventive member having a step-like shape is formed by laminating the three kinds of color layers 2A to 2C of red color, blue color and green color. FIG. 4 is a diagram of the organic EL display in cross section, prepared in this Example.

Then, a protective layer of an acrylic resin is formed on the color filters by a spin coating method. The thickness of the protective layer was 1 μm. On the protective layer, an ITO film was formed followed by etching to thereby form anode wires and cathode supplementary wires. The thickness of the cathode supplementary wires is 300 nm.

Then, a polyimide solution was coated on the substrate surface provided with the anode wires to form thereon an insulation film having a thickness of 0.7 μm. Subsequently, the polyimide film at positions corresponding to display pixels is removed to form openings. In this case, the polyimide film is removed so that each opening has a square shape of 300 μm×300 μm.

Then, separators are formed on the polyimide film so that 64 cathode wires can be arranged in a separated state. The separators are formed by coating an acrylic resin on the insulation film. In this case, each separator is formed to assume an inverted taper structure wherein the height of the separator is 3.4 μm.

Then, a metal mask having openings is disposed on the glass substrate so that the positions of the openings of the metal mask correspond to the positions at which thin organic layers are to be provided, and a space of 50 μm can be maintained between the metal mask and the glass substrate. An ethyl benzoate solution obtained by dissolving 0.5% (mass %) of polyvinyl carbazole is coated on the masked glass substrate by a mask spray method to form a hole injection layer.

Then, on the hole injection layer, α-NPD (N,N'-di(napthalen-1-yl)-N,N'-diphenyl-benzidine) is vapor-deposited to form a hole transfer layer having a thickness of 40 nm. On this, a Alq (tris(8-hydroxyquinolinato)aluminum) as a host compound for a light emitting layer and coumarin 6 as a fluorescent pigment for a guest compound are vapor-deposited simultaneously to form a light emitting layer having a thickness of 60 nm.

Then, LiF is vapor-deposited on the light emitting layer to form a cathode interface layer having a thickness of 0.5 nm. Subsequently, aluminum is vapor-deposited on the interface layer to form cathode wires having a thickness of 100 nm. As a result, the aluminum film are separated by the separators whereby 64 cathode wires are provided.

A sealing material is coated on another substrate other than the glass substrate, and the other substrate is placed so as to oppose the glass substrate provided with the organic EL device. As the sealing material, an ultraviolet curing epoxy resin is used. The sealing material is applied to the other substrate on the outer periphery of the region opposing the organic EL display. After these two substrates are opposed, U.V. rays are irradiated to cure the sealing material whereby these substrates are bonded together. Then, the bonded product is heated at 80° C. for 1 hour in a cleaned oven to accelerate the curing of the sealing material. Thus, the paired substrates with the sealing material can assure the space between these substrates holding the organic EL display therebetween and can isolate the space between these substrates from the outside environment.

After obstructive things at or near the outer periphery of the substrates have been removed, a signal electrode driver is connected to the anode wires, and a scanning electrode driver is connected to the cathode supplementary wires.

In this Example, the liquid-material-spreading preventive member prevents the solution for a thin organic film from spreading to the location where it may contact with the sealing material or the location where a cathode wire is in contact with a cathode supplementary wire. Accordingly, a highly reliable organic EL display can be fabricated. Further, unevenness of the thickness of the thin organic layers can be reduced, and unevenness in light emission from each display pixel, when the organic EL display is activated, can be reduced.

Example 2

An organic EL display is produced in the same manner as Example 1 except that the shape of the liquid-material-spreading preventive member is different. The liquid-material-spreading preventive member is formed by laminating colored layers in the order of red color, blue color and green color in the same manner as Example 1. However, the photolithography mask for the color filters is prepared for each color. The widths of the color layers of red color, blue color and green color in the direction of spreading of the liquid material are 200 μm, 195 μm and 185 μm respectively. The cross-sectional shape at a color filter side of the liquid-material-spreading preventive member is formed to have a step-like shape and the cross-sectional shape at a cathode supplementary wire side is made to be a rectangular shape. Each height of the color layers 2A to 2C of red color, blue color and green color is 0.7 μm.

Figure 13:
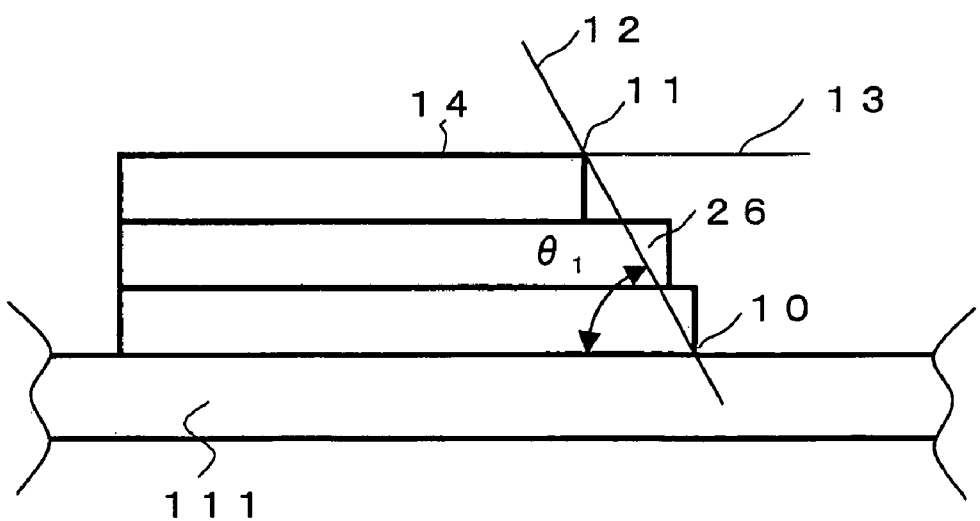
FIG. 13 is a diagrammatical cross-sectional view showing the liquid-material-spreading preventive member in Example 2.

FIG. 5 is a diagram showing the organic EL display of this Example in cross section, FIG. 13 is a cross-sectional view showing mainly the liquid-material-spreading preventive member for the organic EL display of this Example. In this case too, the spreading of the solution can be prevented and a highly reliable organic EL display can be produced in the same manner as Example 1. Unevenness in light emission at the time of activating the organic EL display can not be recognized.

Example 3

Figure 14:
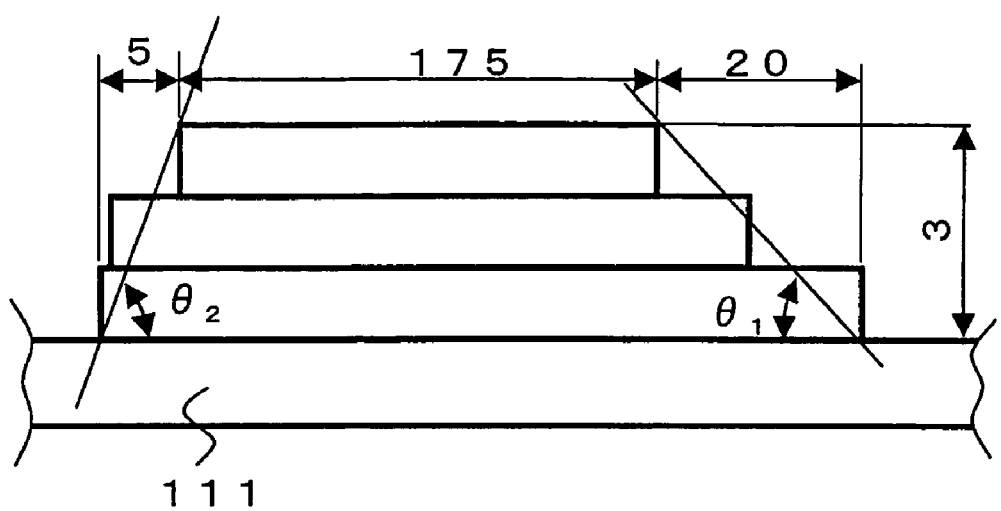
FIG. 14 is a diagrammatical cross-sectional view showing the liquid-material-spreading preventive member in Example 3.

An organic EL display is produced in the same manner as Example 1 except that the shape of the liquid-material-spreading preventive member is different. The liquid-material-spreading preventive member is formed by laminating colored layers in the order of red color, blue color and green color in the same manner as Example 1. However, the photomask for the color filters is prepared for each color. The width of the color layers of red color, blue color and green color in a direction of spreading the liquid material are 200 μm, 195 μm and 175 μm respectively. The cross-sectional shape of the liquid-material-spreading preventive member in a color filter side as well as a cathode supplementary wire side is formed to have a step-like shape. Each height of the color layers 2A to 2C for red color, blue color and green color is 1.0 μm. FIG. 2 is a diagram showing the organic EL display of this Example in cross section. FIG. 14 is a cross-sectional view showing mainly the liquid-material-spreading preventive member in the organic EL display of this Example.

In this case too, the spreading of the solution can be prevented, and a highly reliable organic EL display can be produced in the same manner as Example 1. Further, unevenness in light emission at the time of activating the organic EL display can not be recognized.

According to the method for producing the organic EL display of the present invention, the liquid-material-spreading preventive member is formed at a position other than a display pixel area before a liquid material is coated whereby the liquid material can be prevented from spreading. Accordingly, the reduction of the bonding strength of the sealing material due to the spreading of the liquid material can be prevented with the result that a highly reliable organic EL display can be produced. Further, since the formation of a resistive element contacting the second electrode can be prevented, the organic EL display capable of suppressing generation of heat in operation can be produced. Further, unevenness in the film thickness of the organic compound layers can be suppressed whereby unevenness in the light emission from the organic EL display can be reduced.

According to the organic EL display of the present invention, since the liquid-material-spreading preventive member is formed at a position other than a display pixel area, the reduction of the bonding strength of the sealing material caused by the contact of the sealing material with the liquid material can be prevented. That is, reduction in reliability can be prevented. Further, since the formation of a resistive element contacting the second electrode can be prevented, generation of heat in operation can be reduced. Further, since unevenness in the film thickness of the organic compound layers can be suppressed, unevenness of light emission can be reduced.

The entire disclosure of Japanese Patent Application No. 2003-284133 filed on Jul. 31, 2003 including specification, claims, drawings and summary is incorporated herein by reference in its entirety.

What is claimed is:

1. An organic EL display comprising: a substrate and a first plurality of color layers, a first electrode, a plurality of organic compound layers, a second electrode, and a convex portion having a laminate structure including a second plurality of color layers, wherein at least one layer in the plurality of organic compound layers is a liquid material, the convex portion is configured to contain the liquid materials and is provided at a position other than a display pixel area, and a surface area of an upper layer in the convex portion is smaller than a surface area of a lowermost layer in the convex portion.

2. The organic EL display according to claim 1, wherein the width of the upper layer in the convex portion, in a vertical cross-sectional view of the convex portion, is made continuously smaller than the width of the lowermost layer in the convex portion.

3. The organic EL display according to claim 1, wherein $\theta_1$ is from 0.17 to 0.41 and $\theta_2$ is from 0.17 to 0.41 where $\theta_1$ represents an elevation angle observed from a point where the lowermost layer in the convex portion contacts the substrate surface to a corner portion of the uppermost layer, at a side of the convex portion in cross section, and $\theta_2$ represents an elevation angle observed from a point where the lowermost layer in the convex portion contacts the substrate surface to the corner portion of the uppermost layer, at the other side of the convex portion.

4. The organic EL display according to claim 1, wherein $\theta_1$ is from 0.75 to 1.8 and $\theta_2$ is from 0.75 to 1.8 where $\theta_1$ represents an elevation angle observed from a point where the lowermost layer in the convex portion contacts the substrate surface to a corner portion of the uppermost layer, at a side of the convex portion in cross section, and $\theta_2$ represents an elevation angle observed from a point where the lowermost layer in the convex portion contacts the substrate surface to the corner portion of the uppermost layer, at the other side of the convex portion.

5. The organic EL display according to claim 1, wherein the convex portion is symmetrical in its vertical cross-sectional shape.

6. The organic EL display according to claim 1, wherein the layer thickness of each color layer of the convex portion is substantially equal.

7. The organic EL display according to claim 1, wherein the order of color arrangement of the laminated layers is the same as the order of color arrangement of each display pixel.

8. The organic EL display according to claim 1, wherein the width of each color layer in the laminate structure is substantially the same, and the convex portion is formed by shifting the position of each color layer by a predetermined length n when the plurality of color layers are laminated.

9. The organic EL display according to claim 1, wherein the space between adjacent color layers of the first plurality of color layers in each display pixel has a predetermined length n.

10. The organic EL display according to claim 1, wherein the first and second plurality of color layers-include three different colors, respectively.

* * * * *